United States Patent [19]

Ito et al.

[11] 4,325,103
[45] Apr. 13, 1982

[54] PROVISIONAL FIXING STRUCTURE OF ELECTRONIC TUNER

[75] Inventors: Katsuo Ito, Kanazawa; Kazunori Yoshimura, Nonoichi, both of Japan

[73] Assignee: Murata Manufacturing Co., Ltd., Japan

[21] Appl. No.: 103,168

[22] Filed: Dec. 13, 1979

[30] Foreign Application Priority Data

Dec. 28, 1978 [JP] Japan ............................ 53-182913[U]

[51] Int. Cl.³ .......................... H05K 7/14; H05K 1/08
[52] U.S. Cl. ................................. 361/424; 174/35 R; 361/399
[58] Field of Search .......................... 211/41; 334/85; 361/331, 395, 399, 417, 419, 420, 422, 424, 429; 174/35 R, 35 M, 35 S; 312/242; 248/221.4, 221.3, 73

[56] References Cited

U.S. PATENT DOCUMENTS

| | | | |
|---|---|---|---|
| 2,611,807 | 9/1952 | Lazzery | 361/424 |
| 2,974,919 | 3/1961 | Brown | 248/221.4 |
| 3,368,150 | 2/1968 | Worcester | 361/424 |
| 3,721,746 | 3/1973 | Knappenberger | 361/424 |
| 3,931,946 | 1/1976 | Soltysik | 248/221.4 |

Primary Examiner—Gerald P. Tolin
Attorney, Agent, or Firm—Ostrolenk, Faber, Gerb & Soffen

[57] ABSTRACT

A housing for an electronic tuner or the like comprises: a shield frame defining a space to house circuitry, and an auxiliary base plate enclosing one side of the space left open by the frame and preferably serving to shield the circuitry in cooperation with the shield frame. A novel structure is disclosed for mechanically securing the auxiliary base plate to the shield frame simply and in such a manner that the auxiliary base plate can be easily removed if necessary. The frame and the auxiliary base plate engage each other elastically and resiliently by means of tongues, apertures and/or notches. No special step of either soldering or bending the auxiliary base plate or shield frame with pliers, etc., is required to maintain the parts in position. One or more shield plates may be supported by the auxiliary base plate and the shield frame and divide the space into sections.

10 Claims, 31 Drawing Figures

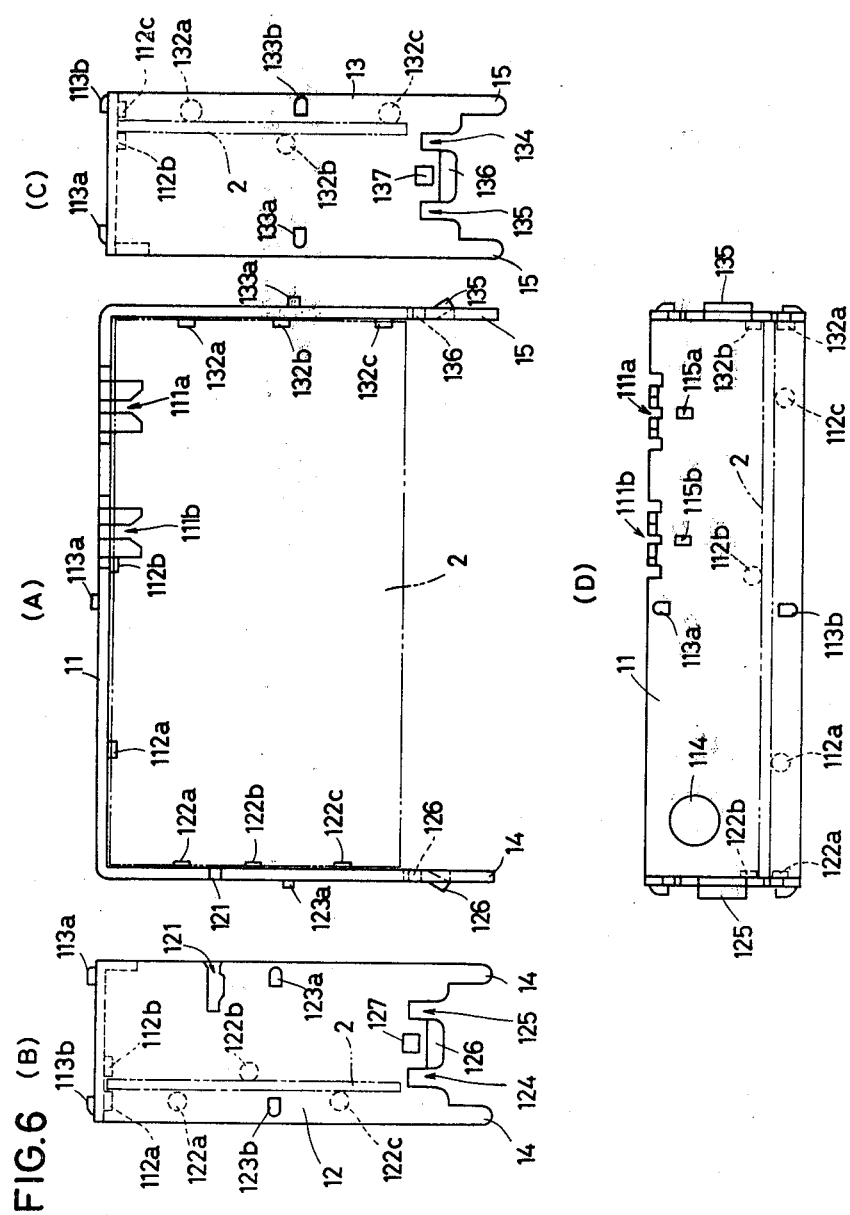

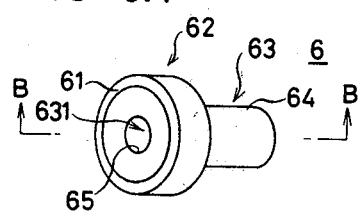
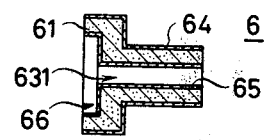
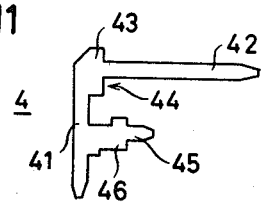
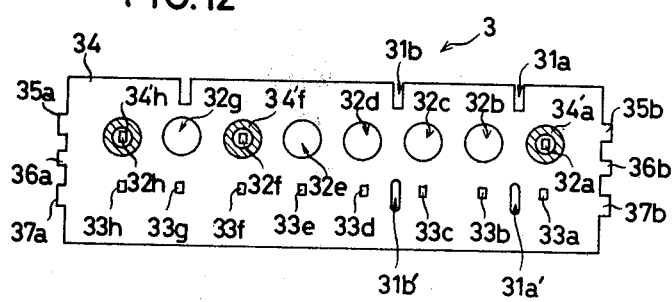
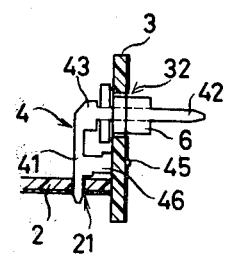
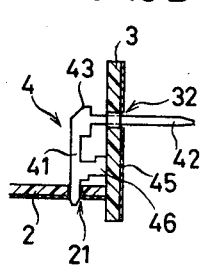
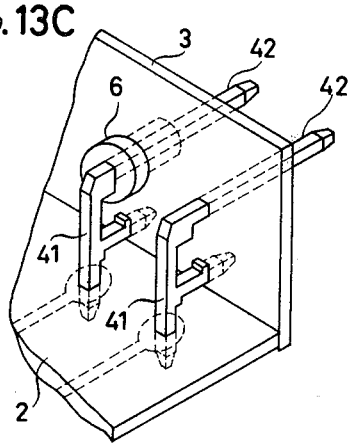

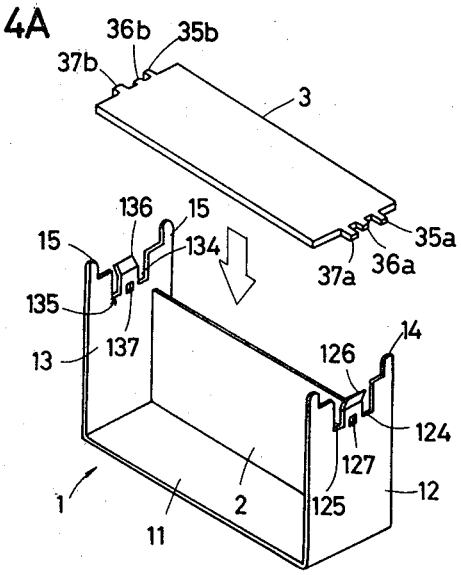
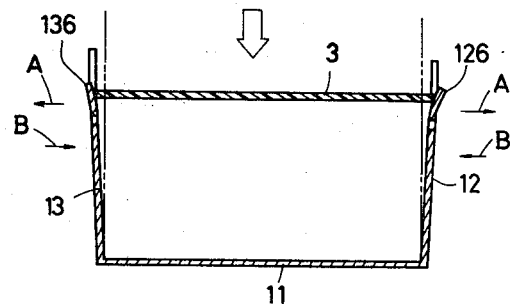
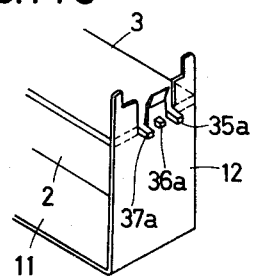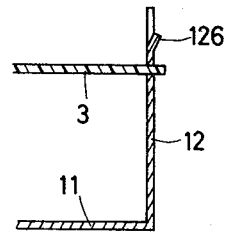

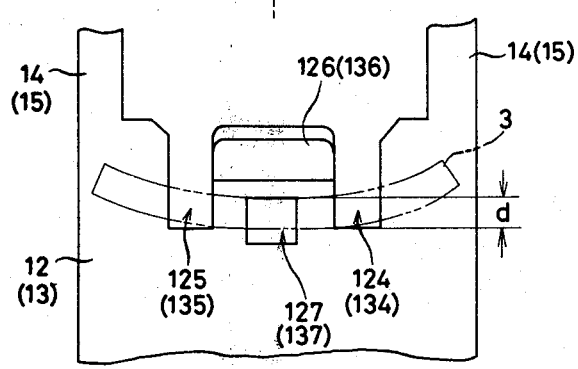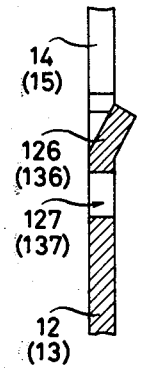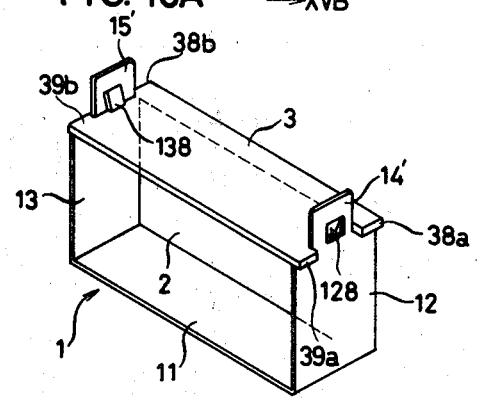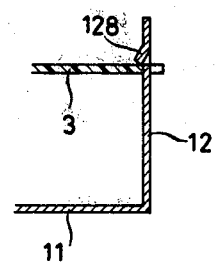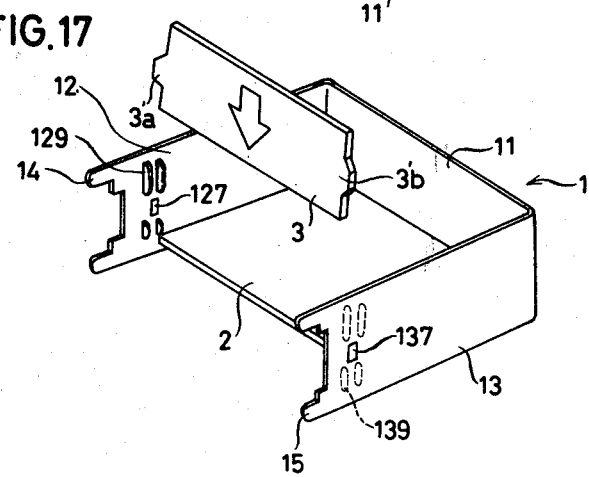

PROVISIONAL FIXING STRUCTURE OF ELECTRONIC TUNER

BACKGROUND OF THE INVENTION

1. Field of the Invention

The present invention relates to a provisional fixing structure for use in assembling an electronic tuner. More specifically, the present invention relates to a structure for provisionally fixing the respective components in an assembled state in assembling an electronic tuner.

2. Description of the Prior Art

FIG. 1 is a perspective view showing one example of an electronic VHF television tuner, in which the present invention can be advantageously employed. The electronic tuner 100 comprises the following principal components: a frame 1 serving as a shield casing; a circuit base plate 2 serving as a main base plate; an auxiliary base plate 3 serving as a shield and for connecting and fixing external connection terminals 4; shield plates 51 to 53; and cylindrical capacitor elements 6. The cylindrical capacitor elements 6 may comprise the so-called feedthrough capacitors, employing external connection terminals 4 as feedthrough conductors.

The frame 1 is made of a plate of conductive material such as iron, which comprises an elongated flat plate portion 11 extending in the vertical direction, and side plate portions 12 and 13 extending parallel to each other and crossing the above described flat plate portion 11 at substantially a right angle at both ends thereof. The free end of the side plate portion 12 is formed with pins 14 for fixing the tuner to a base plate, not shown, and the free end of the side plate portion 13 is formed with similar pins 15 for the same purpose. The flat plate portion 11 of the frame 1 is further formed with shield plate retaining portions 111a and 111b for retaining one end of each of shield plates 51 and 52. The side plate portion 12 is formed with a shield plate retaining portion 121 for retaining one end of shield plate 53. The auxiliary base plate 3 is fixed at the free ends of the frame 1, i.e. the free ends of the side plate portions 12 and 13.

The above described auxiliary base plate 3 is formed with a copper foil covering one entire surface thereof, as to be depicted in FIG. 12, to provide a shield effect. The auxiliary base plate 3 is formed with shield plate retaining portions 31a and 31b each corresponding to the above described shield plate retaining portions 111a and 111b, respectively. The end portions of the auxiliary base plate 3 are coupled and fixed to the free ends of the side plate portions 12 and 13.

In integrally assembling various components of electronic tuner 100, particularly the frame 1, the main base plate 2 and the auxiliary base plate 3, it is necessary to provisionally fix them in a united state before it is possible to secure them to each other permanently. Therefore, conventionally such approaches as shown in FIGS. 2, 3A and 3B are employed.

More specifically, referring to FIG. 2, the main base plate 2 is inserted into the frame 1 and then an auxiliary base plate 3 is brought to abut on the free ends of the side plate portions 12 and 13 of the frame. Then the abutting portions are provisionally fixed, by solder 7, for example. The approach shown in FIGS. 3A and 3B comprises formation of a pair of protrusions 71 at the free end of each of the side plate portions 12 and 13 of the frame 1. The auxiliary base plate 3 is positioned there, and the protrusions 71 are bent outward as shown in FIG. 3B, so that the auxiliary base plate 3 is caulked.

Besides the approaches shown in FIGS. 2, 3A and 3B, a further provisional fixing structure using bolting is employed. However, all of the conventional provisional fixing structures require incidental work, which makes a manufacturing process complicated and expensive. In particular, the approach employing soldering shown in FIG. 2 involves the problem that it is extremely difficult to achieve the desired provisional fixing in such a state that the frame 1, the main base plate 2, the auxiliary base plate 3, the external connection terminals 4 shown in FIG. 1, the shield plates 51 to 53, the feedthrough capacitor units 6 and the like are integrally united, without the auxiliary base plate 3 being inclined. Furthermore, the approach shown in FIGS. 3A and 3B employing caulking also involves the problem that it is extremely difficult to perform a caulking operation after such components as described above are integrally united, without damaging any components, particularly the base plate, and without using a jig.

SUMMARY OF THE INVENTION

In order to eliminate the above described problems, the present invention comprises a provisional fixing structure, wherein a structure is formed at each of the free ends of the side plate portions of the frame for engaging the auxiliary base plate 3. A structure for the side plates is formed at each end of the auxiliary base plate. These structures are such that when engaged with each other, they are maintained in position by virtue of the elasticity of the side plate portions, whereby the respective components are provisionally fixed in their assembled position.

According to one embodiment of the present invention, in fixing the auxiliary base plate into the frame after the main base plate is fixed into the frame, the free ends of the side plate portions are spread apart, and the auxiliary base plate is fitted between them with their respective engagement structures in engagement with each other. This assembled state is maintained by the elasticity of the side plate portions, which compress the auxiliary base plate between them. Therefore, according to the present invention, any provisional fixing expedient which involves incidental work conventionally required can be dispensed with. As a result, the number of components and the number of types of assembly steps required are reduced, and hence the assembly cost is reduced, while productivity is enhanced. In particular, any difficulty involved in soldering or caulking work is completely eliminated, and thus an electronic tuner suited for mass production is provided.

In a preferred embodiment of the present invention, each of the engaging portions of the frame comprises an aperture and notches surrounding the aperture, while the auxiliary base plate is formed at each of both ends thereof with protrusions for engaging the aperture and notches. Size, shape and placement of the apertures and of the notches are such as to ensure tight, elastic engagement of the frame with the auxiliary base plate. Accordingly, provisional fixing of the auxiliary base plate to the frame is performed with ease, while disassembly from the provisional fixed state, if necessary, can also be performed with extreme ease.

Accordingly, a principal object of the present invention is to provide an improved structure for an electronic tuner.

Another object of the present invention is to provide a novel structure for provisonally fixing various components in an assembled state in assembling an electronic tuner.

A further object of the present invention is to provide a provisional fixing structure in assembling an electronic tuner, which enables simple and assured provisional fixing.

Still a further object of the present invention is to provide a provisional fixing structure for an electronic tuner, such that a provisional fixed state can be disassembled with ease.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows a preferred embodiment of a frame, in which FIG. 6A is a front view, FIG. 6B is a left side view, FIG. 6C is a right side view, and FIG. 6D is a plan view;

FIGS. 10A and 10B are views showing one example of a cylindrical capacitor unit, wherein FIG. 10B is a sectional view taken along the line B—B in FIG. 10A;

FIG. 11 is a view showing one example of a connection terminal;

FIG. 12 is a view showing one example of an auxiliary base plate;

FIGS. 13A to 13C are views showing a united state of the main base plate, the connection terminals, the auxiliary base plate and the cylindrical capacitor units, employed as necessary;

FIGS. 14A to 14D are diagrammatic views depicting the assembly steps of one preferred embodiment of the present invention;

FIGS. 15A and 15B are views depicting another preferred example of the embodiment;

FIGS. 16A and 16B are views showing another embodiment of the present invention; and FIG. 17 is a perspective view showing a further embodiment of the present invention.

DESCRIPTION OF THE PREFERRED EMBODIMENTS

Figure 1:
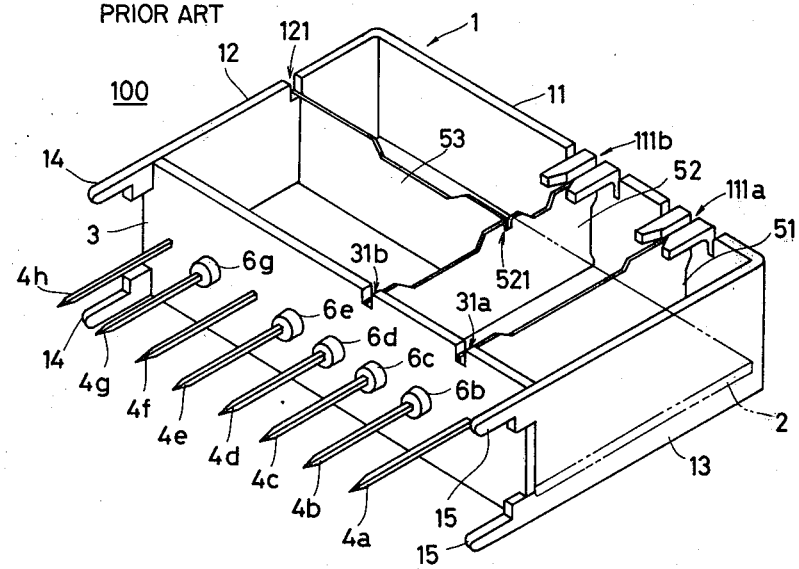
FIG. 1 is a perspective view showing one example of a VHF television tuner, wherein the present invention can be advantageously employed.
Figure 4:
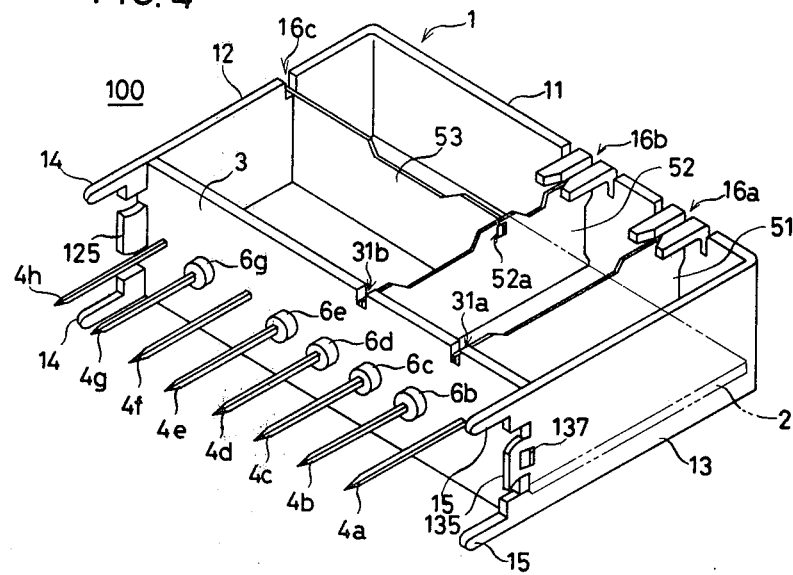
FIG. 4 is a perspective view showing one embodiment of the present invention.
Figure 5:
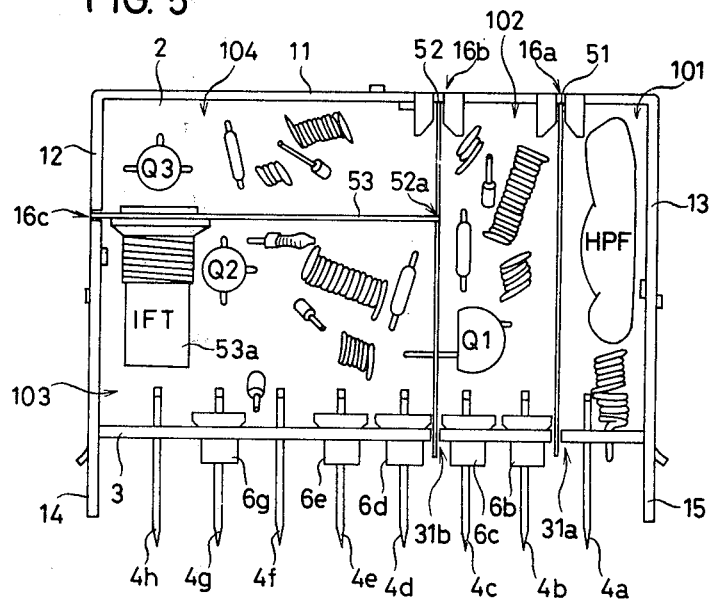
FIG. 5 is a plan view of the FIG. 4 embodiment.

FIG. 4 is a perspective view showing an electronic VHF television tuner by way of one embodiment of the present invention. FIG. 5 is a plan view of the FIG. 4 VHF television tuner. The tuner 100 of the embodiment shown also comprises the respective components 1, 2, 3, 4, 51 to 53 and 6, as in the case of the FIG. 1 conventional tuner. A shield case or a frame is shown in FIG. 6. As described previously with reference to FIG. 1, the frame 1 is made of a conductive material and comprises a flat plate portion 11, and side plate portions 12 and 13 extending at a right angle from both ends of the flat plate portion 11 and parallel to each other. The flat plate portion 11 is formed with protrusions 112a, 112b and 112c for guiding and positioning a circuit base plate or a main base plate 2, when the same is fitted into the frame 1 in the manner as shown by two dotted lines in FIG. 6. Similar protrusions are also formed on the side plate portions 12 and 13 and are denoted as 122a, 122b and 122c, and 132a, 132b and 132c. Further protrusions 113a and 113b are formed on the side surface of the flat plate portion 11 for engagement with hooks, not shown, on the shield covers, not shown in FIG. 6, when the shield covers are mounted to the frame 1. Similar protrusions are also formed on the side plate portions 12 and 13 and are denoted as 123a and 123b, and 133a and 133b. More specifically, two shield covers, not shown in FIG. 6, are ultimately mounted to the frame 1, thereby to complete an electronic tuner. Referring to FIG. 6, the shield plate supporting portions 111a, 111b and 121 are the same as those described previously with reference to FIG. 1. The flat plate portion 11 is further formed with apertures 115a and 115b for the shield plates 51 and 52 to be supported by the shield plate supporting portions 111a and 111b, respectively.

Figure 7A:
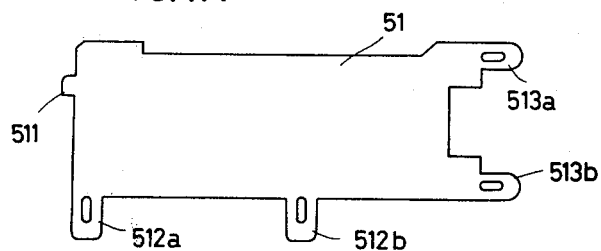
FIGS. 7A to 7C are views showing examples of a shield plate.
Figure 7B:
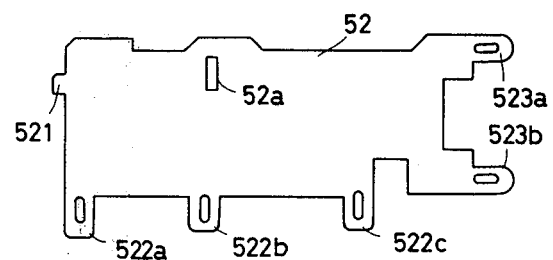
Figure 7C:
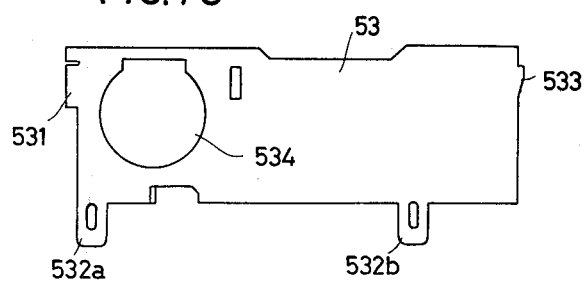

The shield plate 51 comprises five inserting protrusions 511, 512a, 512b, 513a and 513b, as shown in FIG. 7A. The protrusion 511 is fitted into the aperture 115a and the protrusions 513a and 513b are fitted to the shield plate supporting portions 31a and 31a' of the auxiliary base plate (FIG. 12). The shield plate 52 comprises six inserting protrusions 521, 522a, 522b, 522c, and 523a and 523b. The protrusion 521 is fitted into the aperture 115b. The protrusions 523a and 523b are fitted into the shield plate supporting portions 31b and 31b' of the auxiliary base plate 3 (FIG. 12). The shield plate 53 comprises four inserting protrusions 531, 532a, 532b and 533, as shown in FIG. 7C. The protrusion 531 is inserted into the shield plate supporting portion 121 of side plate 12 and the protrusion 533 is fitted to the shield plate supporting portion 52a of the shield plate 52 (FIG. 7B). The inserting protrusions 512a and 512b of the shield plate 51 shown in FIG. 7A are inserted into the apertures or the notches 23a and 23b, respectively, of the main base plate 2, shown in FIG. 8. The inserting protrusions 522a, 522b and 522c of the shield plate 52 shown in FIG. 7B are similarly inserted into the apertures or the notches 23c, 23d and 23e, respectively, of the main base plate 2, shown in FIG. 8. Furthermore, the inserting protrusions 532a and 532b of the shield plate 53 shown in FIG. 7C are inserted into the apertures or the notches 23g and 23f of the main base plate 2. The aperture 534 of the shield plate 53 is for mounting an intermediate frequency transformer 53a, as shown in FIG. 5.

Figure 8:
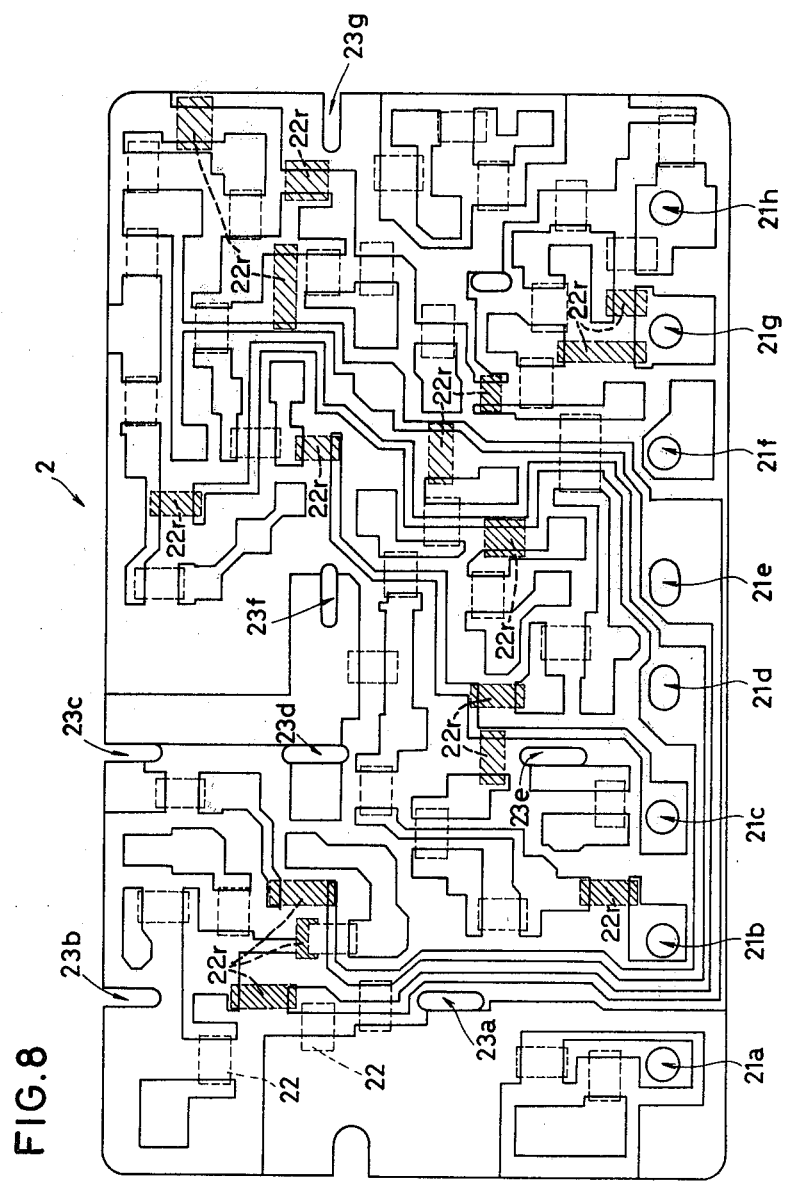
FIG. 8 is a view showing an example of a main base plate.

The circuit base plate or the main base plate 2 is formed of a print pattern as shown in FIG. 8 and is further provided with passive element chips such as a plurality of capacitors 22 serving as circuit components and connected to predetermined portions of the print pattern and mechanically fixed to the main base plate 2. The main base 2 is preferably made of alumina ceramics in consideration of their advantages in thermal strength and a thermal expansion coefficient. Referring to FIG.

8, the hatched portions 225 show where resistor films are formed to serve as passive elements, wherein the resistor film is disposed between prescribed portions of the print pattern in electrical contact therewith. The main base plate 2 is formed with first apertures 21a to 21h for insertion of external connection terminals 4a to 4h and for electrical and mechanical connection of these external connection terminals 4a to 4h to the main base plate 2. It is pointed out that those apertures 21a and 21h are formed at the portions in association with the print pattern where the above described external connection terminals 4a to 4h are to be connected. It is further pointed out that FIG. 8 is a rear view of the circuit base plate 2. FIG. 8 does not particularly illustrate apertures suitable for mounting such active and passive elements as shown in FIG. 5, however.

Figure 9:
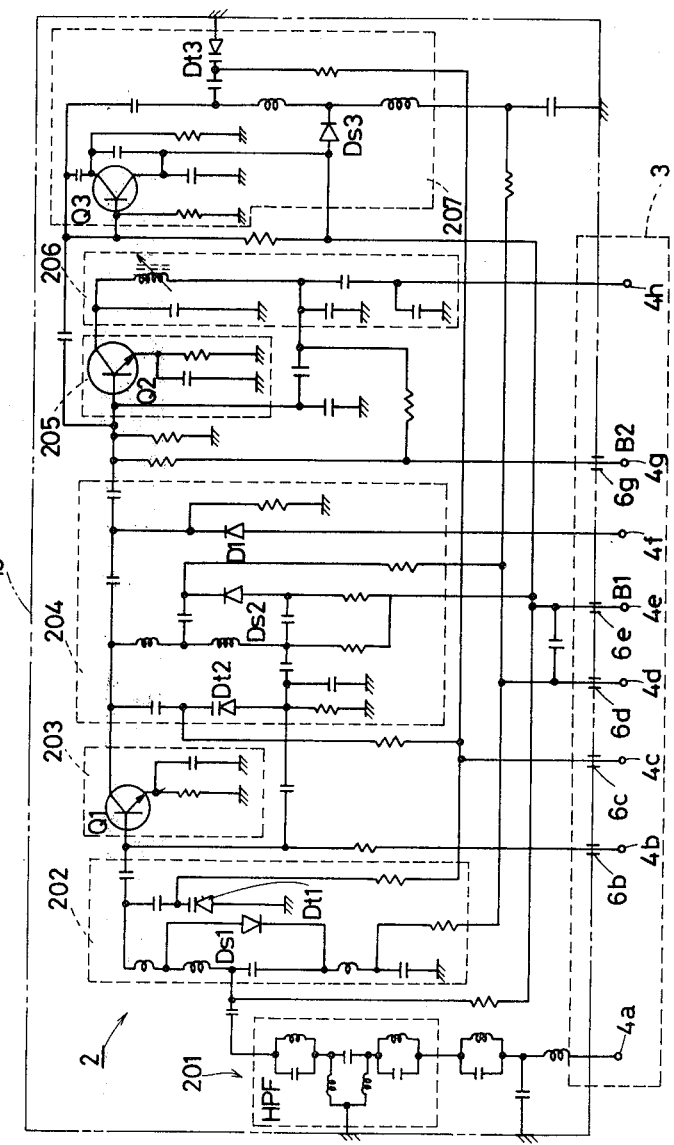
FIG. 9 shows a schematic diagram of the FIG. 8 embodiment.

FIG. 9 is a schematic diagram of the electronic tuner of the embodiment shown in FIGS. 4 and 5. Referring to FIG. 9, the reference numeral 201 denotes an input tuning stage including a high pass filter HPF. The reference numeral 202 denotes a preselector stage, the reference numeral 203 denotes an RF amplifying stage, the reference numeral 204 denotes a band pass selector stage, the reference numeral 205 denotes a mixer stage, the reference numeral 206 denotes an IF first stage, and the reference numeral 207 denotes a local oscillator stage. The external connection terminals 4a to 4h shown in FIGS. 4 and 5 are connected to the corresponding components in the manner as shown in FIG. 9. As better seen in FIG. 4, the cylindrical capacitor elements 6b, 6c, 6d, 6e and 6g each have the external connection terminals 4b, 4c, 4d, 4e and 4g, respectively, inserted through the respective hollow bores thereof.

The shield plates 51, 52 and 53 are provided to electrically shield the respective circuit stages of the electronic tuner 100 from each other. The shield casing or frame 1 thus structured includes compartments 101, 102, 103 and 104. The compartment 101 shown in FIG. 5 is allotted to accommodate the circuit components of the input tuning stage 201 shown in the FIG. 9 schematic diagram such as the high pass filter HPF. The compartment 102 is allotted to accommodate the circuit components of the preselector stage 202 and the RF amplifying stage 203 shown in the FIG. 9 schematic diagram, such as a transistor Q1 and so on. The compartment 103 is allotted to accommodate the circuit components of the band pass selector stage 204, the mixer stage 203 and the intermediate frequency first stage 206 shown in the FIG. 9 schematic transformer. The intermediate frequency transformer is mounted to the shield plate 53, as described previously. The compartment 104 is allotted to accommodate those components of the local oscillator stage 207 shown in the FIG. 9 schematic diagram, such as a transistor Q3 and so on.

An example of specific dimensions of the electronic tuner 100 shown in FIGS. 4 and 5 will be described. In one example, the width of the electronic tuner 100, i.e. the length of the flat plate portion 11, is about 46 mm, the lengths of the side plate portions 12 and 13, including the pins 14 and 15, respectively, are about 33 mm, and the height, i.e. the thickness of the shield case 1, is about 13 mm. On the other hand, the print base plate 2 is about 43 mm in length and about 25 mm in width. The intervals between adjacent ones of the respective apertures 21a to 21h of the circuit base plate 2 are each about 5 mm. The length of the auxiliary base plate 3 shown in FIG. 7A is about 4 mm and the width thereof is about 13 mm. The intervals of the second apertures 32a and 32h are each about 5 mm. As better seen from the above described specific example of dimensions, the inventive electronic television tuner is very compact as compared with conventional ones.

Figure 2:
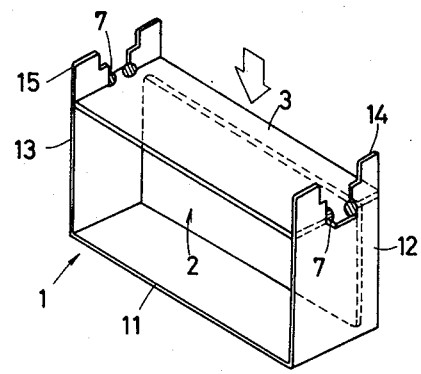
FIG. 2 is a view showing one example of a conventional provisional fixing structure in assemblage.
Figure 3A:
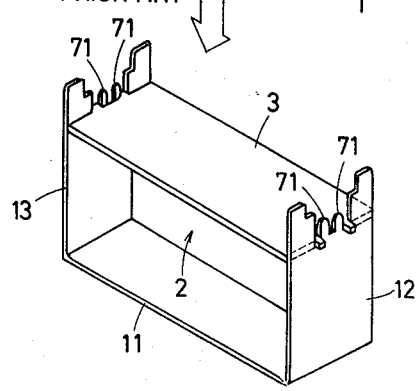
FIGS. 3A and 3B are views showing another example of a conventional provisional fixing structure in assemblage.
Figure 3B:
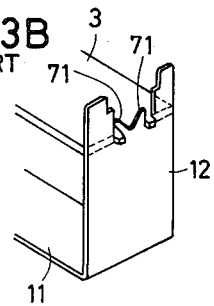

Accordingly, it is extremely difficult to perform provisional fixing in accordance with such conventional approaches as shown in FIGS. 2 and 3, particularly in case of a small sized apparatus. Therefore, the inventive provisional fixing structure can be employed with extreme advantage.

Returning to FIG. 6, characteristic features of the embodiment shown will be described. More specifically, as seen from FIGS. 6B and 6C, a structure for provisional fixing has been employed at the free ends of the side plate portions 12 and 13 of the frame 1. Pins 14 are formed at the tip end of the side plate portion 12 and a tongue shaped portion 126 is defined by notches 124 and 125. The tongue shaped portion 126 is further formed with an aperture 127. Similarly, the side plate portion 13 is also formed with pins 15, notches 134 and 135 and a tongue shaped portion 136 with an aperture 137. These portions will be described subsequently in more detail in conjunction with a description of the function thereof.

FIG. 10A is a perspective view of one example of a cylindrical capacitor element 6 for use in the present invention and FIG. 10B is a sectional view taken along the line B—B in FIG. 10A. The cylindrical capacitor element 6 is made of a dielectric material 61 such as a ceramic and comprises a cylindrical portion 63 having a flange portion 62 formed at the end of the same. As better seen in FIG. 10B, the flange portion 62 is formed with a concavity 66, whereby the distance between electrodes 64 and 65 has been made as small as possible. The electrodes 64 and 65 are formed on the outer and inner surfaces, respectively, of the flange portion 62 and of the cylindrical portion 63, with both electrodes electrically isolated from each other. In forming such cylindrical capacitor element 6, first a dielectric unit 61 including the flange portion 62 and the cylindrical portion 63 is fabricated. Then the unit 61 is immersed in a plating bath, so that the electrode film is formed on the whole surface of the unit 61. Thereafter, the end surface of the flange portion 62 and the end surface of the cylindrical portion 63 are removed by means of a grinder, for example, so that two electrodes 64 and 65 are electrically isolated from each other. The other end of a corresponding external connection terminal 4 is inserted into the hollow bore 631 of the cylindrical portion 63 and is electrically connected to the electrode 65.

FIG. 11 is a view showing one example of an external connection terminal for use in the embodiment. The external connection terminal 4 is structured in substantially an F letter shape, which includes arms 41 and 42 and a protrusion 45. The tip end of the arm 41 is inserted into each of the apertures 21a to 21h shown in FIG. 8, while the tip end of the other arm 42 is inserted into the hollow bore of the cylindrical capacitor element 6 or into one of the apertures 32a, 32f and 32h of the auxiliary base plate 3. The arm 42 is formed with a large width portion 43, so that the end edge 44 of the large width portion 43 abuts against the end surface of the concave portion 66 of the cylindrical capacitor element 6 (FIG. 10B), thereby to urge the cylindrical capacitor element 6 toward the auxiliary base plate 3. The protrusion 45 is effectively utilized for positioning and tentatively fixing the external connection terminals 4 in connecting and fixing the same to the auxiliary base plate 3 in a manner described below. The protrusion 45 is inserted into the corresponding one of the third apertures 33a to 33h formed in the auxiliary base plate 3 shown in FIG. 12. Preferably, the tip end of the protrusion 45 is selected to be of a contour which allows for pressure insertion into the third aperture 33. Pressure insertion of the protrusion 45 into the aperture 33 of the auxiliary base plate 3 achieves provisional fixing during assembly of the auxiliary base plate 3, external connection terminals 4 and the cylindrical capacitor elements 6. Furthermore, the protrusion 45 is formed with a second protrusion or flange 46 so that the second protrusion 46 abuts against the auxiliary base plate 31 around the corresponding aperture 33, thereby to position the external connection terminal 4 in cooperation with the protrusion 45.

FIG. 12 is a view showing one example of the auxiliary base plate 3. The auxiliary base plate 3 is covered with the conductive foil 34 except for the area occupied by the conductive foils 34'a, 34'f and 34'h located on it surrounding the apertures 32a, 32f and 32h and the hatched portions shown in FIG. 12. The auxiliary base plate 3 is formed with the apertures 32a, 32f and 32h for the external connection terminals 4a, 4f and 4h, respectively, and apertures 32b, 32c, 32d, 32e and 32g for the cylindrical capacitor elements 6b, 6c, 6d, 6e and 6g, respectively. The auxiliary base plate 3 is further formed with notches or apertures 31a, 31a', 31b and 31b'. The notches or apertures 31a, 31a', 31b and 31b' are allotted for connection and fixing of the shield plates 51 and 52. Furthermore, the auxiliary base plate 3 is formed with the apertures 33a to 33h depicted previously in conjunction with the external connection terminal 4. The auxiliary base plate 3 is further formed at both ends with a plurality of tabs or protrusions 35a, 36a and 37a and 35b, 36b and 37b serving as engaging portions. These protrusions 35a and 35b are formed to be fittable into the notches 124 and 134 of the frame 1 (FIG. 6), the protrusions 36a and 36b are formed to be fittable into the apertures 127 and 137, and the protrusions 37a and 37b are formed to be fittable into the notches 125 and 135, respectively.

The auxiliary base plate 3 and the previously described main base plate 2 are coupled by means of the connection terminal 4 as shown in FIG. 11. FIG. 13A shows a sectional view of the connection terminal 4, as assembled, through the cylindrical capacitor element 6 and FIG. 13B shows a sectional view of the connection terminal 4, as assembled, in the absence of a cylindrical capacitor element 6. FIG. 13C is a fragmentary rear perspective view showing the connection manner of the connection terminals 4, as assembled.

As better seen in FIGS. 13A, 13B and 13C, one arm 41 of the external connection terminal 4 is inserted through the aperture 21 of the main base plate 2 and is electrically connected to the corresponding portion of the print pattern. At the same time, the other arm 42 of the external connection terminal 4 is inserted through the hollow bore 631 of the cylindrical capacitor element 6 to extend outward of the auxiliary base plate 3. In such a situation the electrode 64 (FIG. 10B) of the cylindrical capacitor element 6 is electrically connected and fixed to the conductive foil 34 of the auxiliary base plate 3. One arm 42 of the external connection terminal 4 is electrically connected and fixed to the electrode 65 of the cylindrical capacitor element 6. The conductive foil 34 of the auxiliary base plate 3 as well as the shield casing 1 is connected to the ground of such as a chassis. Accordingly, the external connection terminal 4 is coupled to the ground through the electrostatic capacitance of the cylindrical capacitor element 6.

As shown in FIG. 13B, in the absence of a cylindrical capacitor element, one arm 42 of the external connection terminal 4 is mechanically fixed by means of the conductive foil portion 34a', 34f' or 34h', as shown in FIG. 12. Meanwhile, if and when the F letter shaped external connection terminals 4 are employed, improper orientation of the cylindrical capacitor elements 6 can be effectively prevented in assembling the auxiliary base plate 3 by means of the protrusion 45, while accurate positioning can also be achieved thereby.

In the foregoing, an embodiment of a VHF television tuner has been described. A provisional fixing structure embodying the inventive features will be described in more detail in the following.

FIGS. 14A to 14D are views depicting the assembly steps in accordance with a preferred embodiment of the present invention. As described previously, the embodiment shown is characterized by the shape and structure of the free ends of the side plate portions 12 and 13 of the frame 1 and the shape of both ends in the longitudinal direction of the auxiliary base plate 3 in association with the geometry of the side plate portions 12 and 13. With simultaneous reference to FIGS. 15A and 15B, a major portion of the free end of the side plate portion 12 or 13 of the frame will be described in detail. FIG. 15A shows a side view of the free end of the side plate portion 12 or 13 and FIG. 15B is a sectional view taken along the line XVB—XVB in FIG. 15A. The distance d shown in FIG. 15A is selected to be slightly larger than the thickness of the auxiliary base plate 3 in order to facilitate fitting of the same into the frame 1. The size of the aperture 127(137) is similarly selected to be slightly larger than the protrusion 36a(36b) being inserted into it in order to prevent damage to a press mold, not shown, used in forming the frame 1. Since too large a rectangular aperture 127(137) could cause leakage of an electromagnetic wave through that portion, the aperture 127(137) should be preferably selected to be the smallest possible size in consideration of the above described pressing mold.

Meanwhile, the above described distance d may be smaller than the thickness of the auxiliary base plate 3. This causes the auxiliary base plate 3 being fitted to be bent, as shown in an exaggerated manner by two dotted lines in FIG. 15A, thereby to make the provisional fixing more secure. As a result, looseness in the subsequent steps is eliminated and not only the auxiliary base plate 3 but also the circuit base plate 2 and the shield plates 51-53 become stable.

Now one example of the steps of assembling the electronic tuner 100 will be described. First of all the main base plate 2 having a pattern of copper foil formed on the rear surface and having desired resistor patterns printed thereon (FIG. 8) is prepared. Then capacitor chips and the like are adhered by an adhesive agent to the rear surface of the main base plate 2. Coils, transistors, diodes and the like are inserted on the front or upper surface of the main base plate 2 and the lead wires thereof are bent at the rear surface of the main base plate or fixed to the main base plate by means of an adhesive agent. The main base plate 2 is then inserted between the side plate portions 12 and 13 of the frame 1. The protrusions 112a to 112c, 122a to 122c and 132a and 132c of the frame 1 are effective in aiding in the insertion step. In particular, while the tip ends of the terminals of the auxiliary base plate 3 with the external connection terminals 4a to 4h and the feedthrough capacitor units 6b, 6c, 6d, 6e and 6g mounted as shown in FIG. 4 are fitted into the main base plate 2, the auxiliary base plate 3 is fitted between the side plate portions 12 and 13 of the frame 1. Then, as shown in FIG. 14B, the auxiliary base plate 3 is fitted between the side plate portions 12 and 13 while the auxiliary base plate 3 pushes both of the side plate portions 12 and 13 outward in the direction shown by arrows A. The inclined tongue shaped portions 126 and 136 serve to guide both ends of the auxiliary base plate 3. When the auxiliary base plate 3 is further pushed in, the protrusions 35a and 37a and 35b and 37b of the auxiliary base plate 3 are fitted into the corresponding notches, as shown in FIG. 14C, and then the protrusions 36a and 36b are fitted into the corresponding apertures 127 and 137, as shown in FIG. 14C and in FIG. 14D. More specifically, as shown by the arrow B in FIG. 14B, the side plate portion 12 is returned to its original position. The final state shown in FIG. 14C is maintained by the elasticity of the side plates 12 and 13. Thus, the provisional fixing of the respective components in a united state is performed.

Thereafter, the assembly is visually inspected for such defects as in the feedthrough capacitor units 6, incorrect kind of intermediate frequency transformer, cracks in the circuit base plate or the main base plate, and improperly mounted chip capacitors 22, and the shield plates 51 and 52 are inserted. In the event that defects are found through the above described visual inspection, the above described provisional fixed state of the assembly facilitates removal of the defective components, including disassembly of the unit if necessary. More specifically, if disassembly is necessary for replacement of defective components, the side plate portions 12 and 13 of the frame 1 are spread apart as indicated by arrows A in FIG. 14B, allowing the auxiliary base plate 3 to be removed. Then the shield plate 53 is inserted, which is followed by dipping the rear surface of the main base plate 2 in solder. Then the front surface of the auxiliary base plate 3 is dipped, which may be preceded by fixing the shield plates 51 and 53, inserted as described previously, by twisting the claws formed at the tip ends thereof, thereby to prevent deformation of curvature of the auxiliary base plate 3 by virtue of heat on the occasion of dipping.

FIGS. 16A and 16B are views showing another embodiment of the present invention. The embodiment shown is substantially the same as the conventional one, except for the following respects. More specifically, one pin 14' is formed at the free end of the side plate portion 12 of the frame 1, and similarly a pin 15' is formed at the free end of the side plate portion 13. The pin 14' and 15' are formed with inclined tongue shaped portions 128 and 138, respectively. On the other hand, the auxiliary base plate 3 is formed with protrusions 38a and 39a and 38b and 39b at both ends thereof in the longitudinal direction so as to sandwich the pins 14' and 15' as shown in FIG. 16A. In the embodiment shown, the auxiliary base plate 3 is fitted between the side plate portions 12 and 13, while both of them are spread outward. As seen from FIG. 16B, in particular the inclined portions 128 and 138 serve to depress the inserted auxiliary base plate 3. In the embodiment shown, the components of the assembly are maintained in this assembled state by virtue of the elasticity of the side plate portions 12 and 13 being exerted in the directions of the arrows A and B in FIG. 14B.

Although the above described embodiment is adapted such that the auxiliary base plate 3 is fitted from the free end side of the front side of the side plate portions 12 and 13, alternatively the same may be performed from above or below, as shown in FIG. 17, for the purpose of provisional fixing. To that end, the embodiment shown in FIG. 17 is provided with guides or protuberances 129 and 139 above and below rectangular apertures 127 and 137 formed on the side plate portions 12 and 13 for guiding the protrusions 3a' and 3b' of the auxiliary base plate 3. The auxiliary base plate 3 is fitted in the direction indicated by the arrow in FIG. 17 between the guides 129 and 139, so that the protrusions 3a' and 3b' may be engaged with the apertures 127 and 137, respectively. In the case of this embodiment shown, as well, the assembled state is maintained by virtue of the elasticity of the side plate portions 12 and 13 of the frame 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic tuner, comprising:
a frame made of an electrically conductive material and having an elongated flat plate portion extending in a horizontal direction and side plate portions extending from both ends of said flat plate portion at substantially right angles and parallel to each other;
a main base plate fixed to said frame and having opposite main surfaces, one main surface of said main base plate having a printed pattern for a predetermined electronic circuit on said main base plate, said main base plate having a first plurality of apertures formed therein near one side edge of said main base plate;
an auxiliary base plate connected to the distal end of each of said side plate portions of said frame such that said auxiliary base plate is adjacent said one side edge of said main base plate and said frame, said main base plate and said auxiliary base plate cooperate to define an interior space therebetween, said auxiliary base plate having opposite main surfaces, one main surface of said auxiliary base plate facing said space, the opposite main surface of said auxiliary base plate having an electrically conductive film formed on substantially the whole surface thereof, said auxiliary base plate being provided with a second plurality of apertures equal in number to the number of said first plurality of apertures, each of said apertures of said second plurality of apertures corresponding to a different said aperture of said first plurality of apertures in said main base plate such that each aperture of said first set of apertures forms a set with its corresponding aperture of said second set of apertures;
a plurality of connection terminals equal in number of the number of said first and second pluralities of apertures, each of said connection terminals corresponding to a different said set of apertures, a first end terminal of each of said connection terminals extending through its corresponding one of said first plurality of apertures in said main base plate, a second end terminal of each of said connection terminals extending through the corresponding one of said second plurality of apertures of said auxiliary base plate to said opposite main surface side of said auxiliary base plate;

a shield plate having opposite ends supported by said frame and said auxiliary base plate, respectively, for shielding said electronic circuit formed on said main base plate;

first provisional fixing means for provisionally fixing said main base plate in such a position that said main surface of said main base plate which is opposed to said main surface of said main base plate having said electronic circuit formed thereon faces said space;

second provisional fixing means for provisionally fixing said auxiliary base plate to said distal end of said side plate portions of said frame with said first end terminal of each of said connection terminals being inserted into the corresponding one of said first plurality of apertures of said main base plate and said second end terminal of each of said connection terminals being inserted into the corresponding one of said second plurality of apertures of said auxiliary base plate;

said second provisional fixing means comprising first engagement means formed at the respective distal ends of said side plate portions of said frame, and second engagement means formed at opposite ends of said auxiliary base plate and engaged with corresponding ones of said first engagement means formed on said side plate portions;

said side plate portions of said frame cooperating with said flat plate portion of said frame such that said side plate portions are elastic in a direction parallel to said flat plate portion such that said side plate portions hold said second engagement means, thereby to provisionally fix said frame, said main base plate, said auxiliary base plate, said plurality of connection terminals and said shield plate in a united state; and solder means for permanently affixing said auxiliary base plate to said frame.

2. The tuner of claim 1, wherein said auxiliary base plate is generally planar, and wherein the distal end of each of said side plate portions is elastic in a respective direction away from each other and parallel to the plane defined by said generally planar auxiliary base plate.

3. The tuner of claim 1, wherein said first engagement means comprises respective apertures in said distal ends of said side plate portions, and wherein said second engagement means comprises a respective tab on opposite ends of said auxiliary base plate.

4. The tuner of claim 3, wherein said first engagement means further comprises means defining respective notches in said distal ends of said side plate portions, and wherein said second engagement means further comprises additional protrusions formed on said opposite ends of said auxiliary base plate and engaging respective ones of said notches.

5. The tuner of claim 4, wherein each of said apertures defined in said distal ends of said side plate portions is located between two of said notches, whereby each of said apertures is formed in a tongue-shaped portion defined between said notches.

6. The tuner of claim 5, wherein said tongue-shaped portions are arcuate and extend in directions which are generally away from each other.

7. The tuner of any one of claims 4-6, wherein said first and second engagement means cooperate in such a manner that there is some play between said first and second engagement means along the direction of extension of each of said side portions.

8. The tuner of claim 1, wherein said first engagement means comprises respective tongue-shaped portions located at each of said distal ends, each of said tongue-shaped portions having a first end secured to said distal end of said side plate portion and having a second end pointing generally towards said space, said second end engaging said auxiliary base plate.

9. The tuner of claim 1, wherein said first engagement means comprises a respective aperture formed on each of said side plate portions and a plurality of pairs of protrusions formed on each of said side plate portions, the two protrusions of each of said pairs facing each other to define therebetween a guide way having one end adjacent a said aperture, and wherein said second engagement means comprises a respective tab located at opposite ends of said auxiliary base plate, said tab engaging a respective one of said apertures, the portions of said end of said auxiliary base plate means adjacent a given one of said tabs engaging the ones of said guideways adjacent said aperture.

10. The tuner of any one of claims 1, 3, 8 or 9, wherein said first provisional fixing means comprises a plurality of protrusions formed on each of said side plate portions for positioning said main base plate adjacent said space.

* * * * *